(12) United States Patent
Yugawa

(10) Patent No.: US 11,602,048 B2
(45) Date of Patent: Mar. 7, 2023

(54) WIRING BOARD

(71) Applicant: KYOCERA Corporation, Kyoto (JP)

(72) Inventor: Hidetoshi Yugawa, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 173 days.

(21) Appl. No.: 17/057,776

(22) PCT Filed: Jun. 21, 2019

(86) PCT No.: PCT/JP2019/024729
§ 371 (c)(1),
(2) Date: Nov. 23, 2020

(87) PCT Pub. No.: WO2020/004271
PCT Pub. Date: Jan. 2, 2020

(65) Prior Publication Data
US 2021/0227691 A1 Jul. 22, 2021

(30) Foreign Application Priority Data
Jun. 26, 2018 (JP) .............. JP2018-121022

(51) Int. Cl.
H05K 1/09 (2006.01)
H05K 1/11 (2006.01)
H05K 3/46 (2006.01)

(52) U.S. Cl.
CPC .............. *H05K 1/09* (2013.01); *H05K 1/115* (2013.01); *H05K 3/4644* (2013.01); *H05K 2201/09609* (2013.01)

(58) Field of Classification Search
CPC ........ H05K 1/09; H05K 1/115; H05K 3/4644; H05K 3/24; H05K 3/243; H05K 3/244;
(Continued)

(56) References Cited

U.S. PATENT DOCUMENTS

2006/0000877 A1 1/2006 Wang
2009/0044971 A1* 2/2009 Kataoka ................. H05K 3/365
174/257

(Continued)

FOREIGN PATENT DOCUMENTS

JP 09-092964 A 4/1997
JP 2002-185108 A 6/2002
(Continued)

*Primary Examiner* — Roshn K Varghese
(74) *Attorney, Agent, or Firm* — Volpe Koenig

(57) ABSTRACT

A wiring board of the present disclosure comprises an insulating layer, a first conductor layer located on the surface of the insulating layer and containing any one of nickel and chromium, a metal belonging to group of the periodic table; or a metal belonging to group of the periodic table, a second conductor layer located inside the outer circumferential edge on the first conductor layer and containing copper, a third conductor layer located on the surface of the insulating layer in a state of covering the first conductor layer and the second conductor layer and containing nickel, and a fourth conductor layer located in a state of covering the third conductor layer and containing gold. The third conductor layer has an overhanging part extending outward from the outer circumferential edge of the first conductor layer, and the fourth conductor layer is located between the overhanging part and the insulating layer.

7 Claims, 4 Drawing Sheets

(58) Field of Classification Search
CPC . H05K 2201/09609; H05K 2201/2072; H05K 1/111; H05K 3/3452; H05K 3/429; H05K 3/4655; H01L 23/49866; H01L 23/5383; H01L 23/12; H01L 23/5384; H01L 2224/16225
See application file for complete search history.

(56) References Cited

U.S. PATENT DOCUMENTS

| | | | |
|---|---|---|---|
| 2010/0263921 | A1 | 10/2010 | Nakahara et al. |
| 2013/0240258 | A1* | 9/2013 | Ishida ............... H05K 1/0306 174/258 |
| 2015/0000965 | A1 | 1/2015 | Shiroshita |
| 2015/0305153 | A1 | 10/2015 | Imafuji et al. |

FOREIGN PATENT DOCUMENTS

| | | |
|---|---|---|
| JP | 2009-117542 A | 5/2009 |
| JP | 2015-216344 A | 12/2015 |
| KR | 10-2015-0002492 A | 1/2015 |

* cited by examiner

WIRING BOARD

TECHNICAL FIELD

The present disclosure relates to a wiring board.

BACKGROUND ART

Nowadays, a wiring board with highly functional electronic components are being developed. The wiring board has a plurality of electrodes located on the surface of the insulating layer. These electrodes are connected to the electrodes of the electronic components, for example, via solder. As the number of electrodes increases and the size of electrodes decreases due to the higher functionality of electronic components, the electrodes on the wiring board are also required to be downsized.

PRIOR ART DOCUMENTS

Patent Documents

Patent Document 1: Japanese Unexamined Patent Publication No. 2015-216344

SUMMARY OF THE INVENTION

Problem to be Solved by the Invention

As described above, when the size of the electrodes on the wiring board is decreased, the connection area between the electrodes and the insulating layer becomes smaller, and the connection strength between them may become smaller. In such a case, when electronic components are mounted on the wiring board, for example, cracks may occur between the electrodes and the insulating layer due to stress on the electrodes. This may result in an incomplete connection between the wiring board and the electronic components, which may prevent the electronic components from operating properly.

Means for Solving the Problem

A wiring board of the present disclosure comprises an insulating layer, a first conductor layer located on the surface of the insulating layer and containing any one of nickel and chromium, a metal belonging to group 4 of the periodic table; or a metal belonging to group 6 of the periodic table, a second conductor layer located inside the outer circumferential edge on the first conductor layer and containing copper, a third conductor layer located on the surface of the insulating layer in a state of covering the first conductor layer and the second conductor layer and containing nickel, and a fourth conductor layer located in a state of covering the third conductor layer and containing gold. The third conductor layer has an overhanging part extending outward from the outer circumferential edge of the first conductor layer, and the fourth conductor layer is located between the overhanging part and the insulating layer.

Effects of the Invention

According to the wiring board of the present disclosure, it is possible to provide a wiring board that enables electronic components to operate stably.

EMBODIMENTS FOR CARRYING OUT THE INVENTION

Figure 1:
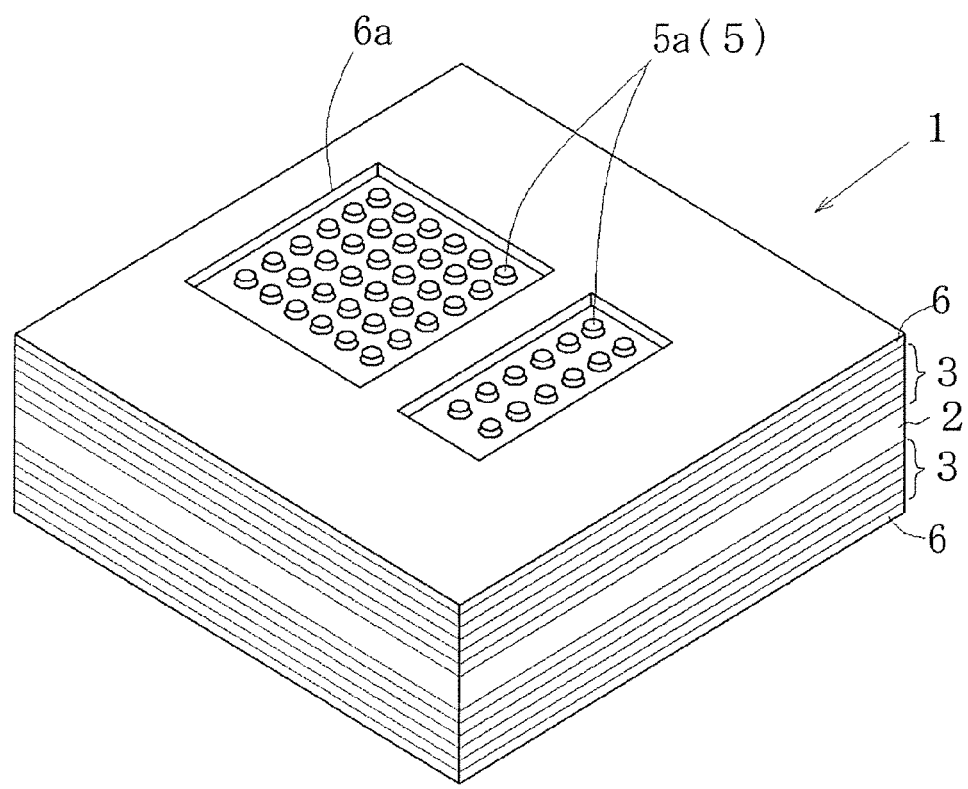
FIG. 1 is a schematic perspective view showing an embodiment example of the wiring board of the present disclosure.
Figure 2:
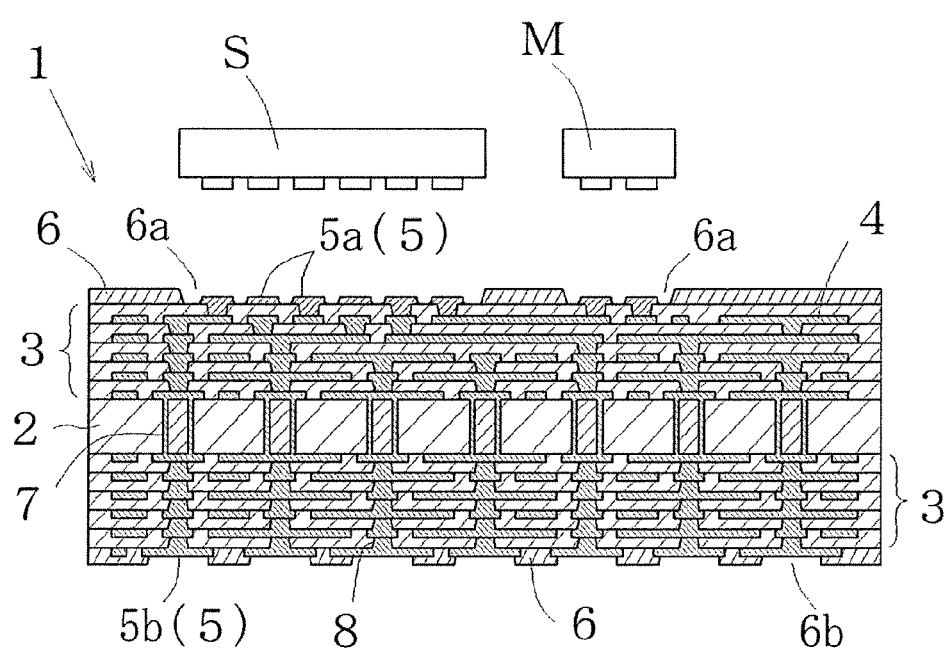
FIG. 2 is a schematic sectional view showing an embodiment example of the wiring board of the present disclosure.
Figure 3:
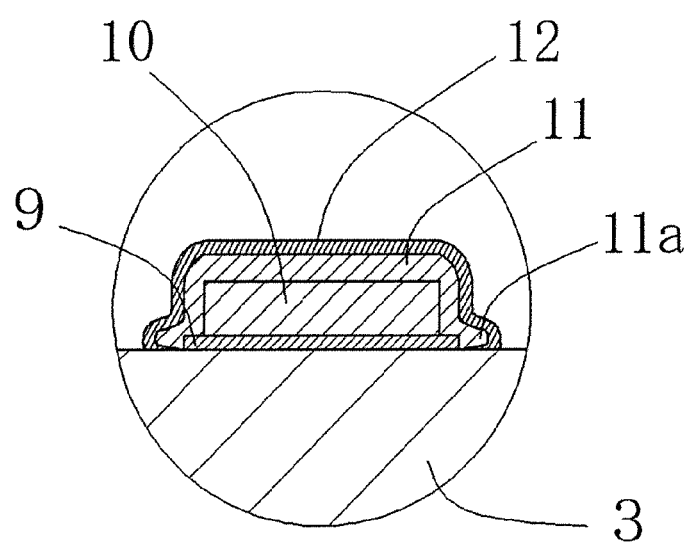
FIG. 3 is an enlarged sectional view showing a main part of an embodiment example of the wiring board of the present disclosure.

Next, a wiring board according to one embodiment of the present disclosure will be described based on FIGS. 1 to 3. The wiring board 1 in one embodiment has a core insulating layer 2, a build-up insulating layer 3, a wiring conductor 4, an electrode 5, and a solder resist 6. The wiring board 1 is in the form of a flat plate with a square shape in plan view. One side of the wiring board 1 has a length of 5 to 80 mm and a thickness of 0.15 to 2.0 mm. On the upper surface of the wiring board 1, for example, a high functional integrated circuit S and a broadband memory M are mounted.

The core insulating layer 2 includes an insulating material such as a reinforcing glass cloth impregnated with an epoxy resin or a bismaleimide triazine resin. The core insulating layer 2 has the function as a reinforcing support body in the wiring board 1. The thickness of the core insulating layer 2 is set, for example, from 50 to 1500 µm. The core insulating layer 2 is formed in a flat plate form by stacking a plurality of prepregs impregnated with a thermosetting resin such as an epoxy resin or a bismaleimide triazine resin in a reinforcing glass cloth and pressing under heating.

The core insulating layer 2 has a plurality of through holes 7 penetrating from the upper surface to the lower surface. The wiring conductors 4 located on the upper and lower surfaces of the core insulating layer 2 are electrically connected to each other through the wiring conductors 4 in the through holes 7. The diameter of the through hole 7 is set between 40 and 500 µm, for example. The through hole 7 is formed by a processing such as drilling, laser machining, or blasting to the core insulating layer 2.

The build-up insulating layer 3 is located on the upper surface and the lower surface of the core insulating layer 2. In the wiring board 1 of one embodiment, five layers of the build-up insulating layers 3 are located on the upper surface and the lower surface, respectively. The build-up insulating layer 3 has the function of securing an area for arranging the wiring conductor 4 on the upper and lower surfaces of the core insulating layer 2, as described below. The build-up insulating layer 3 covers the wiring conductor 4 and has the function of ensuring insulation between the wiring conductors 4 adjacent to each other.

The build-up insulating layer 3 includes an insulating material, such as a polyimide resin, an epoxy resin or a bismaleimide triazine resin. The build-up insulating layer 3 may include glass fibers. However, with respect to the formation of the fine wiring conductor 4 and the formation of minute via hole 8 described below, it is more advantageous not to include glass fibers from the viewpoint of flatness or processability of the build-up insulating layer 3.

The build-up insulating layer 3 contains insulating particles. The insulating particles include, for example, silica (SiO2) and alumina (Al2O3). The insulating particles have a spherical shape, for example, and the average particle size is set to, for example, 0.1 to 0.5 µm. The spherical shape is advantageous for containing a high density of insulating particles. The insulating particles have a role, in the build-up insulating layer 3, such as reducing the thermal expansion coefficient and suppressing the disconnection of the wiring conductor 4. The build-up insulating layer 3 is formed by attaching a film for the insulating layer in which insulating particles are dispersed in a thermosetting resin such as an epoxy resin, on the upper and lower surfaces of the core insulating layer 2 or on the surface of the build-up insulating layer 3 already formed, so as to cover the wiring conductors 4 under a vacuum, and thermally curing.

The build-up insulating layer 3 has a plurality of via holes 8 with the wiring conductors 4 at the bottom. The wiring conductors 4 located above and below through the build-up insulating layer 3 are electrically connected to each other through the wiring conductors 4 in the via holes 8. The diameter of the via hole 8 is set to, for example, 30 to 60 µm. The via hole 8 is formed, for example, by laser processing the build-up insulating layer 3. After laser processing, the inside of the via hole 8 can be cleaned to remove carbides and other foreign substances, thereby improving the connection strength between the via hole 8 and the wiring conductor 4.

The wiring conductors 4 are located on the upper surface and the lower surface of the core insulating layer 2, in the through hole 7, on the upper surface or the lower surface of the build-up insulating layer 3, and in the via holes 8. The wiring conductor constitutes the conductive path of the wiring board 1. The wiring conductor 4 includes a good conductive metal, such as an electroless copper-plated metal and an electrolytic copper-plated metal. The wiring conductor 4 is formed by a plating technique such as a semi-additive or subtractive method. Specifically, the wiring conductor 4 is formed by depositing copper-plated metal on the upper surface and the lower surface of the core insulating layer 2, inside the through hole 7, on the upper and lower surfaces of the build-up insulating layer 3, and in the via hole 8.

The electrode 5 has a first electrode 5a and a second electrode 5b. The first electrode 5a is located on the upper surface of the uppermost build-up insulating layer 3. The second electrode 5b is located on the lower surface of the lowermost build-up insulating layer 3. The first electrode 5a is connected to the electrodes of the electronic components, for example, via solder. As shown in FIG. 3, the first electrode 5a includes a first conductor layer 9, a second conductor layer 10, a third conductor layer 11, and a fourth conductor layer 12.

The first conductor layer 9 is located on the surface of the build-up insulating layer 3. The first conductor layer 9 has the function as an underlying metal for the second conductor layer 10 and includes any one of nickel and chromium; a metal belonging to group 4 of the periodic table such as titanium; or a metal belonging to group 6 of the periodic table such as molybdenum. The first conductor layer 9 has excellent connectivity with the build-up insulating layer 3. The first conductor layer 9 is a circular shape in plan view, for example, with a diameter of 10 to 150 µm and a thickness of 10 to 100 nm.

The first conductor layer 9 is formed, for example, by the sputtering method. The sputtering method is advantageous for improving the connection strength between the build-up insulating layer 3 and the first conductor layer 9 compared to the electroless plating method, because, for example, nickel and chromium are driven into the surface of the build-up insulating layer 3. This improves the connection strength between the first electrode 5a and the build-up insulating layer 3, which is particularly advantageous when the first electrode 5a is very small. The first conductor layer 9, other than the area where the first electrode 5a is located, is removed by etching to prevent a short circuit.

The second conductor layer 10 is located on the upper surface of the first conductor layer 9. The second conductor layer 10 contains copper with excellent conductivity to lower the electrical resistance between the wiring board 1 and the electronic components. The second conductor layer 10 has a cylindrical shape, for example, with a diameter of 7 to 120 µm and a thickness of 5 to 30 µm. The second conductor layer 10 is located, for example, 1.5 to 15 µm inward from the outer circumferential edge on the first conductor layer 9.

The second conductor layer 10 is formed, for example, as follows. First, a thin film layer of copper is formed by the sputtering method on the upper surface of the first conductor layer 9. The thickness of the thin film layer is set between 100 and 700 nm, for example. Next, a copper column in a cylindrical shape is formed on this thin film layer by an electrolytic plating method such as the semi-additive method. By forming the thin film layer of copper in advance on the upper surface of the first conductor layer 9, the electric resistance during electroplating is reduced, which is advantageous in terms of shortening the deposition time of the plating metal.

The third conductor layer 11 is located on the surface of the build-up insulating layer 3, in a state of covering the first conductor layer 9 and the second conductor layer 10. The third conductor layer 11 has the function as a barrier metal to suppress metal diffusion between the second conductor layer 10 and the solder, and it contains nickel.

The third conductor layer 11 may have a palladium film located on the outermost surface. The palladium film is more effective in suppressing metal diffusion than the third conductor layer 11 which contains nickel. Therefore, when the palladium film is located on the outermost surface of the third conductor layer 11, it is advantageous in terms of further suppressing metal diffusion between the second conductor layer 10 and the solder. The thickness of the palladium film is set between 10 and 50 nm, for example. This palladium film is formed, for example, by an electroless plating method.

The third conductor layer 11 has an overhanging part 11a extending outward from the outer circumferential edge of the first conductor layer 9. In other words, the third conductor layer 11 in this example has the overhanging part 11a extending outward along the circumference of the first conductor layer 9, which is a circular shape in plan view. The overhanging part 11a is set, for example, to 3 to 5 µm in the vertical direction (perpendicular to the surface of the build-up insulating layer 3) and to 1 to 8 µm in the horizontal direction (horizontal to the surface of the build-up insulating layer 3). The thickness of the third conductor layer 11, other than the overhanging part 11a, is set to 1 to 3 µm, for example.

The third conductor layer 11 is formed, for example, by an electroless plating method. Compared with the electrolytic plating method, this electroless plating method is advantageous in terms of cost and reduction in the management burden of the equipment, as the plating equipment is simple. It is advantageous to improve the connection strength of the third conductor layer 11 as well as the first conductor layer 9 and the second conductor layer 10 if the surfaces of the first conductor layer 9 and the second conductor layer 10 are cleaned and the oxide film and the like are removed before the electroless plating process is performed.

The fourth conductor layer 12 contains gold. The fourth conductor layer 12 is located in a state of covering the third conductor layer 11 exposed on the surface of the build-up insulating layer 3, as well as between the overhanging part 11a and the build-up insulating layer 3.

The fourth conductor layer 12 covering the third conductor layer 11 described above has the function of suppressing corrosion of the third conductor layer 11. The thickness of the fourth conductor layer 12 covering the third conductor layer 11 is set to, for example, 50 to 500 nm.

The fourth conductor layer 12, which is located between the overhanging part 11a and the build-up insulating layer 3 as described above, has a relaxation function to distribute stress when stress is applied between the overhanging part 11a (namely, the third conductor layer 11) and the build-up insulating layer 3. The first electrode 5a is connected to the electrodes of the electronic components via a solder and is therefore prone to be subjected to stress from the electronic components, for example, when the electronic components are mounted or operated. Therefore, the fourth conductor layer 12 is advantageous in relieving such stress.

The fourth conductor layer 12 containing gold is more ductile than the third conductor layer 11 containing nickel. This makes it possible to distribute stress described above and to suppress the occurrence of cracks between the overhanging part 11a (namely, the third conductor layer 11) and the build-up insulating layer 3.

The second electrode 5b is connected to the electrodes of the external board, for example, via a solder, and constitutes a conductive path between the wiring board 1 and the external board. The second electrode 5b includes a good conductive metal, such as an electroless copper-plated metal and an electrolytic copper-plated metal. The second electrode 5b is formed by depositing copper-plated metal on the lower surface of the lowermost build-up insulating layer 3 by using a plating technique such as a semi-additive or subtractive method.

The solder resist 6 is located on the upper surface of the uppermost build-up insulating layer 3 and the lower surface of the lowermost build-up insulating layer 3. The solder resist 6 has an opening 6a to expose the first electrode 5a and an opening 6b to expose the second electrode 5b. The solder resist 6 is formed by affixing a film made of a photosensitive thermosetting resin, such as an acrylic-modified epoxy resin, to the surface of the build-up insulating layer 3, forming an opening 6a or 6b by exposure and development, and then thermally curing the film.

As described above, the wiring board 1 of one embodiment of the present disclosure comprises the build-up insulating layer 3, the first conductor layer 9 located on the surface of the build-up insulating layer 3 and containing any one of nickel and chromium, the metal belonging to group 4 of the periodic table, or the metal belonging to group 6 of the periodic table, the second conductor layer 10 including copper and located inside the outer circumferential edge on the first conductor layer 9, the third conductor layer 11 including nickel and located on the surface of the build-up insulating layer 3 with the first conductor layer 9 and the second conductor layer 10 covered, and the fourth conductor layer 12 including gold and located in the state of covering the third conductor layer.

The third conductor layer 11 has the overhanging part 11a extending outward from the outer circumferential edge of the first conductor layer 9, and the fourth conductor layer 12 is located between the overhanging part 11a and the build-up insulating layer 3.

The fourth conductor layer 12 containing gold is superior in ductile to the third conductor layer 11 containing nickel. This makes it possible to distribute stress applied to the first electrode 5a and to suppress cracks between the overhanging part 11a (namely, the third conductor layer 11) and the build-up insulating layer 3.

As a result, according to the wiring board 1 of the present disclosure, it is possible to provide the wiring board 1 that has excellent connectivity between the wiring board 1 and the electronic components and enables the electronic components to operate stably. Furthermore, it is advantageous in that the fourth conductor layer 12 is located between the overhanging part 11a and the build-up insulating layer 3, which suppresses corrosion of the lower part of the overhanging part 11a.

For example, it is also advantageous in terms of restraining the sealing resin from infiltrating between the overhanging part 11a and the build-up insulating layer 3 and decreasing the connection strength between them, when the sealing resin is injected between them, after the electronic components are mounted on the wiring board 1.

The present disclosure is not limited to one example of the above-described embodiments, and various changes are possible to the extent that they do not depart from the gist of the present disclosure.

Figure 4:
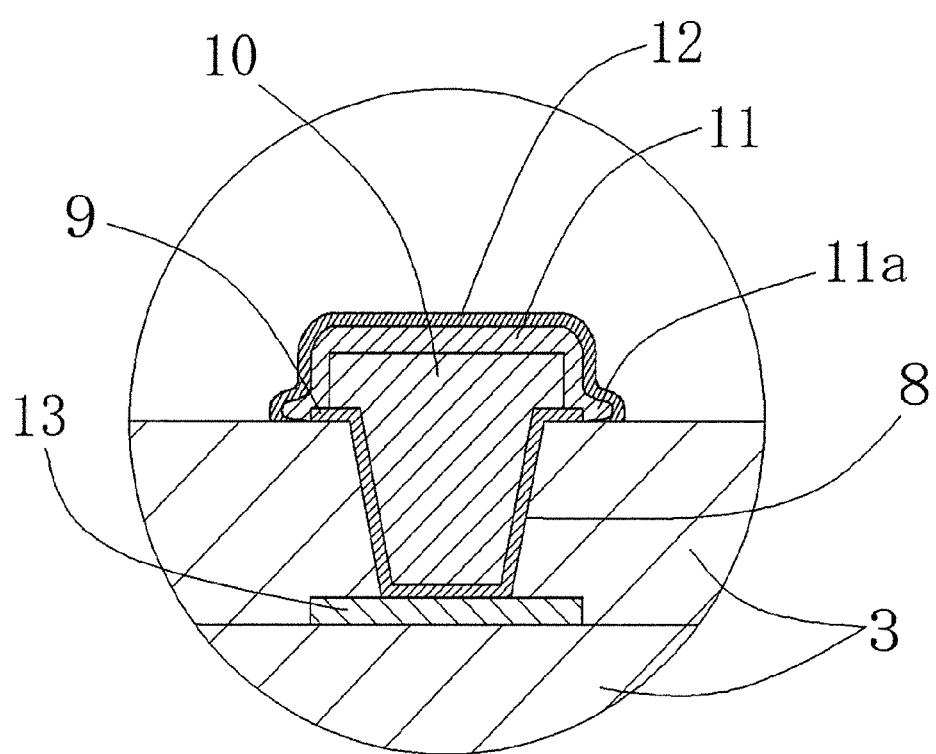
FIG. 4 is an enlarged sectional view showing a main part of another embodiment example of the wiring board of the present disclosure.

In the wiring board 1 according to one embodiment described above, for example, it is shown that the first conductor layer 9 is located on the plane of the build-up insulating layer 3. Apart from this case, as shown in FIG. 4, it may be a case that the build-up insulating layer 3 has the via hole 8 with a via land 13 at the bottom thereof, and the first conductor layer 9 is located around the opening of the via hole 8, on the surface of the build-up insulating layer 3 inside the via hole 8, and on the upper surface of the via land 13.

In such a case, the wiring board 1 of the present disclosure can suppress the occurrence of cracks between the overhanging part 11a (namely, the third conductor layer 11) and the build-up insulating layer 3. As a result, it is advantageous in that the electrical connection between the first electrode 5a and the via land 13 (namely, the lower wiring conductor 4) is maintained in good condition.

In plan view, the surface roughness of the build-up insulating layer 3 where the overhanging part 11a is located may be greater than the surface roughness of the build-up insulating layer 3 where the first conductor layer 9 is located. In this case, the connection area between the fourth conductor layer 12 and the build-up insulating layer 3 is larger, thus improving the connection strength between the two. This is advantageous in terms of suppressing the occurrence of cracks between the overhanging part 11a (namely, the third conductor layer 11) and the build-up insulating layer 3.

In plan view, the surface roughness of the build-up insulating layer 3 where the overhanging part 11a is located, for example, has an arithmetic mean roughness Ra of 0.05 to 0.2 μm, and the surface roughness of the build-up insulating layer 3 where the first conductor layer 9 is located has an arithmetic mean roughness Ra of 0.02 to 0.1 μm. The surface roughness of the latter is always smaller than the surface roughness of the former. It is more advantageous to have a smaller surface roughness of the build-up insulating layer 3 where the first conductor layer 9 is located, in terms of forming the first conductor layer 9 in a flat state.

The surface roughness can be measured based on an image taken with a scanning electron microscope of a cross-section of the build-up insulating layer 3 in the area where, for example, the overhanging part 11a or the first conductor layer 9 is located. Alternatively, after removing the overhanging part 11a or the first conductor layer 9 by etching, the area where they were located may be measured with a contact or non-contact surface roughness measuring device.

One example of the above-described embodiment shows the case that the first electrode 5a is located only on the upper surface side of the wiring board 1. However, in the wiring board of the present disclosure, the first electrode may be located on both or either the upper and lower surfaces. The position of the first electrode 5a may be placed at an appropriate location corresponding to the position where the electronic components are mounted.

DESCRIPTION OF THE REFERENCE NUMERALS

1 Wiring Board
3 Build-up Insulating Layer
8 Via Hole
9 First Conductor Layer
10 Second Conductor Layer
11 Third Conductor Layer
11a Overhanging Part
12 Fourth Conductor Layer
13 Via Land

The invention claimed is:

1. A wiring board comprising:
an insulating layer,
an electrode located on the insulating layer, and
the electrode including:
a first conductor layer located on the surface of the insulating layer, and containing any one of nickel and chromium, a metal belonging to group 4 of the periodic table, or a metal belonging to group 6 of the periodic table,
a second conductor layer located inside away from the outer circumferential edge of the first conductor layer, and containing copper,
a third conductor layer located on the surface of the insulating layer in a state of covering the first conductor layer and the second conductor layer and containing nickel, and
a fourth conductor layer located in a state of covering the third conductor layer, and containing gold,
wherein the third conductor layer comprises an overhanging part extending outward from the outer circumferential edge of the first conductor layer and located to form a gap with the insulating layer, and the fourth conductor layer covers the third conductor layer containing the overhanging part, and is located in the gap and reaches to the insulating layer, and extends outward from the outer circumferential edge of the overhanging part.

2. The wiring board according to claim 1, wherein the insulating layer has a via hole with a via land located at the bottom thereof, and the first conductor layer is located on the surface of the insulating layer around the opening of the via hole and inside the via hole.

3. The wiring board according to claim 1, wherein, in plan view, a surface roughness of the insulating layer in which the overhanging part is located is greater than the surface roughness of the insulating layer in which the first conductor layer is located.

4. The wiring board according to claim 3, wherein the surface roughness of the insulating layer in which the overhanging part is located is 0.05 to 0.2 μm, and the surface roughness of the insulating layer in which the first conductor layer is located is 0.02 to 0.1 μm.

5. The wiring board according to claim 1, wherein the insulating layer comprises a core insulating layer and a build-up insulating layer located on the upper surface and the lower surface of the core insulating layer, and the electrode is located on one or both of the build-up insulating layer located on the upper surface and the lower surface of the core insulating layer.

6. The wiring board according to claim 1, wherein an outermost surface of the third conductor layer is formed with a palladium film.

7. A wiring board comprising:
a core insulating layer,
a first electrode located on the upper surface of the an uppermost build-up insulating layer,
a second electrode located on the lower surface of the a lowermost build-up insulating layer, and
the first electrode including:
a first conductor layer located on the surface of the uppermost build-up insulating layer and containing any one of nickel and chromium, a metal belonging to group 4 of the periodic table, or a metal belonging to group 6 of the periodic table,
a second conductor layer located inside away from the outer circumferential edge on the first conductor layer and containing copper,
a third conductor layer located on the surface of the insulating layer in a state of covering the first conductor layer and the second conductor layer and containing nickel, and
a fourth conductor layer located in a state of covering the third conductor layer and containing gold,
wherein the third conductor layer comprises an overhanging part extending outward from the outer circumferential edge of the first conductor layer and located to form a gap with the insulating layer, and the fourth conductor layer covers the third conductor layer containing the overhanging part, and is located in the gap and reaches to the insulating layer, and extends outward from the outer circumferential edge of the overhanging part, and
wherein the second conductor layer is formed by depositing copper-plate metal on the lower surface of the lowermost build-up insulating layer.

* * * * *